United States Patent
Qin et al.

(10) Patent No.: US 11,340,511 B2
(45) Date of Patent: May 24, 2022

(54) DISPLAY PANEL AND METHOD FOR PREPARING THE SAME, AND METHOD FOR ADJUSTING INTENSITY OF AMBIENT LIGHT REFLECTED THEREON

(71) Applicant: BOE Technology Group Co., Ltd., Beijing (CN)

(72) Inventors: Wei Qin, Beijing (CN); Xiaolong Li, Beijing (CN); Tieshi Wang, Beijing (CN); Jintao Peng, Beijing (CN); Xueling Gao, Beijing (CN); Yanan Niu, Beijing (CN); Kuanjun Peng, Beijing (CN); Shengnan Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 47 days.

(21) Appl. No.: 16/956,066

(22) PCT Filed: Oct. 25, 2019

(86) PCT No.: PCT/CN2019/113405
§ 371 (c)(1),
(2) Date: Jun. 19, 2020

(87) PCT Pub. No.: WO2020/088373
PCT Pub. Date: May 7, 2020

(65) Prior Publication Data
US 2020/0319521 A1    Oct. 8, 2020

(30) Foreign Application Priority Data

Nov. 2, 2018  (CN) .......................... 201811305074.0

(51) Int. Cl.
*G02F 1/155*  (2006.01)
*G02F 1/1335*  (2006.01)
(Continued)

(52) U.S. Cl.
CPC ............ *G02F 1/155* (2013.01); *G02F 1/1336* (2013.01); *G02F 1/133528* (2013.01); *G02F 1/29* (2013.01)

(58) Field of Classification Search
None
See application file for complete search history.

(56) References Cited

U.S. PATENT DOCUMENTS 10,249,262 B2    4/2019  Yang et al.
2005/0122053 A1  6/2005  Ko
(Continued)

FOREIGN PATENT DOCUMENTS

CN    1556664 A  * 12/2004
CN    103293814 A    9/2013
(Continued)

OTHER PUBLICATIONS

Office Action dated Aug. 31, 2020, issued in counterpart CN Application No. 201811305074.0, with English translation (14 pages).

*Primary Examiner* — Phu Vu
(74) *Attorney, Agent, or Firm* — WHDA, LLP

(57) ABSTRACT

A display panel, a method for preparing a display panel and a method for adjusting an intensity of ambient light reflected on a display panel are provided in embodiments of the disclosure. The display panel includes: a base substrate; a plurality of sub-pixel units (20) on the base substrate comprising a plurality of light emitting portions respectively; an electrochromic assembly on a light-emergent side of the plurality of light emitting portions; and a light intensity detector configured to detect an incident intensity of ambient light, and the electrochromic assembly comprises a plurality of electrochromic portions covering the plurality of light emitting portions, respectively; and transmittance of the
(Continued)

plurality of electrochromic portions for ambient light varies with a change in the incident intensity of ambient light.

17 Claims, 10 Drawing Sheets

(51) Int. Cl.
    *G02F 1/13357*    (2006.01)
    *G02F 1/29*    (2006.01)

(56) References Cited

U.S. PATENT DOCUMENTS

| | | | |
|---|---|---|---|
| 2007/0109218 A1* | 5/2007 | Saito | ........................ G09G 3/38 345/55 |
| 2014/0152703 A1 | 6/2014 | Yang et al. | |
| 2015/0221283 A1 | 8/2015 | Jia et al. | |

FOREIGN PATENT DOCUMENTS

| | | | | |
|---|---|---|---|---|
| CN | 103441139 A | | 12/2013 | |
| CN | 103854574 A | | 6/2014 | |
| CN | 106024846 A | | 10/2016 | |
| CN | 106773238 A | * | 5/2017 | ......... H01L 51/5271 |
| CN | 107507854 A | | 12/2017 | |

\* cited by examiner

DISPLAY PANEL AND METHOD FOR PREPARING THE SAME, AND METHOD FOR ADJUSTING INTENSITY OF AMBIENT LIGHT REFLECTED THEREON

CROSS-REFERENCE TO RELATED APPLICATION

This application is a Section 371 National Stage Application of International Application No. PCT/CN2019/113405, filed on Oct. 25, 2019, which claims priority to Chinese Application No. 201811305074.0, filed on Nov. 2, 2018, incorporated herein by reference in their entirety.

TECHNICAL FIELD

Embodiments of the present disclosure generally relate to the technical field of display technology, in particular to a display panel and a method for preparing the same, and a method for adjusting an intensity of ambient light reflected thereon.

BACKGROUND

Organic light emitting diode (OLED) is a development direction of display technology which has been paid much attention. OLED display technology has some advantages such as: self-illumination, relatively high brightness, relatively efficient illumination, relatively fast response, relatively low driving-voltage and relatively low power consumption, relatively low cost, less procedures, and the like. OLED technology is widely used in mobile phones, digital cameras, DVD players, personal digital assistants (PDAs), laptop computers, car audio systems and televisions.

SUMMARY

Some embodiments of the present disclosure provide a display panel, comprising: a base substrate; a plurality of sub-pixel units on the base substrate comprising a plurality of light emitting portions respectively; an electrochromic assembly on a light-emergent side of the plurality of light emitting portions; and a light intensity detector configured to detect an incident intensity of ambient light, and the electrochromic assembly comprises a plurality of electrochromic portions covering the plurality of light emitting portions, respectively; and the transmittance of the plurality of electrochromic portions for ambient light varies with a change in the incident intensity of ambient light.

In some embodiments, the electrochromic assembly further comprises: a first electrode on one side of the plurality of electrochromic portions facing the plurality of light emitting portions; and a second electrode on the other side of the plurality of electrochromic portions distal to the plurality of light emitting portions.

In some embodiments, the plurality of the electrochromic portions and the plurality of the light emitting portions are provided in one-to-one correspondence with each other, and an orthographic projection of each of the plurality of the electrochromic portions on the base substrate overlaps with an orthographic projection of a respective one of the plurality of the light emitting portions on the base substrate.

In some embodiments, each of the plurality of the electrochromic portions displays a color which is the same as that of light emitted by the respective one of the plurality of light emitting portions.

In some embodiments, the display panel further comprises a controller, which is configured to modulate the plurality of electrochromic portions into a color rendering state by applying a first voltage between the first electrode and the second electrode in response to the incident intensity of ambient light higher than a first threshold, and to modulate the plurality of electrochromic portions into a transparent state by applying a second voltage between the first electrode and the second electrode in response to the incident intensity of ambient light lower than the first threshold; and as to each of the plurality of electrochromic portions, a transmittance thereof in the color rendering state for light in the predetermined wavelength range is higher than a transmittance thereof in the color rendering state for light having wavelengths other than in the predetermined wavelength range, but is lower than a transmittance thereof in the transparent state for light in the predetermined wavelength range.

In some embodiments, the display panel further comprises: a liquid crystal adjustment assembly between the electrochromic assembly and the plurality of light emitting portions, or on a side of the electrochromic assembly distal to the plurality of light emitting portions; and a circular polarizer on a side of one of the electrochromic assembly and the liquid crystal adjustment assembly which is more distal to the plurality of light emitting portions than the other, the side being distal to the plurality of light emitting portions.

In some embodiments, the liquid crystal adjustment assembly comprises: a liquid crystal layer; a third electrode, on one side of the liquid crystal layer facing the plurality of light emitting portions; and a fourth electrode, on the other side of the liquid crystal layer distal to the plurality of light emitting portions.

In some embodiments, the display panel further comprises a controller, which is configured to modulate the liquid crystal layer into a first state by applying a third voltage between the third electrode and the fourth electrode in response to the incident intensity of ambient light higher than a second threshold, and to modulate the liquid crystal layer into a second state by applying a fourth voltage between the third electrode and the fourth electrode in response to the incident intensity of ambient light lower than the second threshold; and as to the liquid crystal layer, a polarization state of ambient light passing therethrough remains as original in the first state, but is changed thereby in the second state to an extent that an emission ratio of ambient light from the circular polarizer is higher in the second state than in the first state.

In some embodiments, the liquid crystal layer in the second state has the same properties as a quarter wave plate.

In some embodiments, the controller is further configured to modulate the plurality of electrochromic portions into a color rendering state by applying a first voltage between the first electrode and the second electrode in response to the incident intensity of ambient light higher than a first threshold, and to modulate the plurality of electrochromic portions into a transparent state by applying a second voltage between the first electrode and the second electrode in response to the incident intensity of ambient light lower than the first threshold; and as to each of the plurality of electrochromic portions, a transmittance thereof in the color rendering state for light in the predetermined wavelength range is higher than a transmittance thereof in the color rendering state for light having wavelengths other than in the predetermined wavelength range, but is lower than a transmittance thereof in the transparent state for light in the predetermined wavelength range, and the first threshold is the same as or different from the second threshold.

In some embodiments, the liquid crystal adjustment assembly further comprises: a first controllable switching device configured to apply a potential onto or remove a potential from the third electrode or the fourth electrode.

In some embodiments, the electrochromic assembly further comprises: a second controllable switching device configured to apply a potential onto or remove a potential from the first electrode or the second electrode.

In some embodiments, the electrochromic assembly further comprises a light shielding portion located between any two adjacent electrochromic portions.

In some embodiments, each of the plurality of light emitting portions comprises a cathode, an anode and a light emitting material layer between the cathode and the anode.

Some embodiments of the present disclosure provide a method for preparing a display panel as above, comprising: providing a base substrate; forming a plurality of light emitting portions on the base substrate; and forming an electrochromic assembly on a light-emergent side of the plurality of light emitting portions, the electrochromic assembly comprising a first electrode, a second electrode and a plurality of electrochromic portions covering the plurality of light emitting portions, respectively, and providing a light intensity detector configured to detect an incident intensity of ambient light, and the transmittance of the plurality of electrochromic portions for ambient light varies with a change in the incident intensity of ambient light.

In some embodiments, the method further comprises: forming a liquid crystal adjustment assembly between the electrochromic assembly and the plurality of light emitting portions, or on a side of the electrochromic assembly distal to the plurality of light emitting portions; and forming a circular polarizer on a side of one of the electrochromic assembly and the liquid crystal adjustment assembly which is more distal to the plurality of light emitting portions than the other, the side being distal to the plurality of light emitting portions.

Some embodiments of the present disclosure provide a method for adjusting an intensity of ambient light reflected on the display panel as above, comprising: detecting an incident intensity of ambient light; comparing the incident intensity of ambient light as detected, with a first threshold; and modulating the plurality of electrochromic portions into a color rendering state by applying a first voltage between the first electrode and the second electrode in response to the incident intensity of ambient light which is higher than the first threshold, and modulating the plurality of electrochromic portions into a transparent state by applying a second voltage between the first electrode and the second electrode in response to the incident intensity of ambient light which is lower than the first threshold; and as to each of the plurality of electrochromic portions, a transmittance thereof in the color rendering state for light in the predetermined wavelength range is higher than a transmittance thereof in the color rendering state for light having wavelengths other than in the predetermined wavelength range, but is lower than a transmittance thereof in the transparent state for light in the predetermined wavelength range.

In some embodiments, the display panel further comprises: a liquid crystal adjustment assembly between the electrochromic assembly and the plurality of light emitting portions, or on a side of the electrochromic assembly distal to the plurality of light emitting portions, the liquid crystal adjustment assembly comprising a liquid crystal layer, and a third electrode and a fourth electrode located on both sides of the liquid crystal layer respectively; and a circular polarizer on a side of one of the electrochromic assembly and the liquid crystal adjustment assembly which is more distal to the plurality of light emitting portions than the other, the side being distal to the plurality of light emitting portions, and the method further comprises: comparing the incident intensity of ambient light as detected, with a second threshold; modulating the liquid crystal layer into a first state by applying a third voltage between the third electrode and the fourth electrode in response to the incident intensity of ambient light which is higher than the second threshold, and modulating the liquid crystal layer into a second state by applying a fourth voltage between the third electrode and the fourth electrode in response to the incident intensity of ambient light which is lower than the second threshold; and as to the liquid crystal layer, an polarization state of ambient light passing therethrough remains as original in the first state, but is changed thereby in the second state to an extent that an emission ratio of ambient light from the circular polarizer is higher in the second state than in the first state.

BRIEF DESCRIPTION OF THE DRAWINGS

In order to illuminate technical solutions of embodiments of the disclosure as literally recorded, drawings of the embodiments of the disclosure will be described briefly. It should be known that the drawings as depicted hereinafter merely refer to some embodiments of the disclosure as literally recorded, rather than functioning as a limitation on text of embodiments of the disclosure. In the drawings.

DETAILED DESCRIPTION OF EMBODIMENTS

Figure 1:
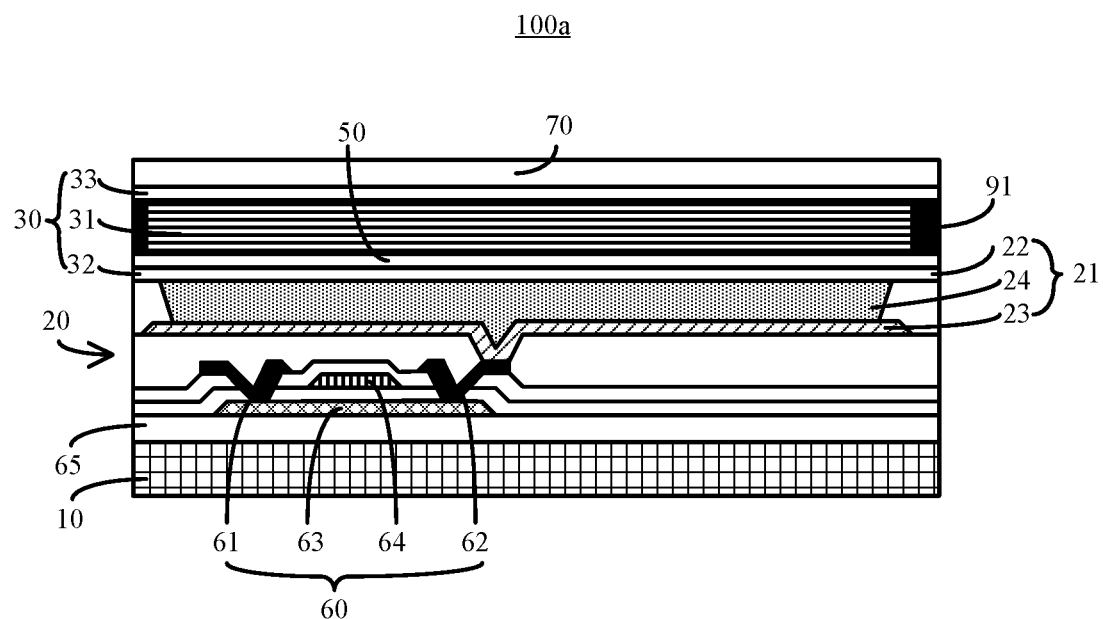
FIG. 1 illustrates a schematic structural view of a display panel according to an embodiment of the disclosure.

In order to more clearly explain the purpose, technical solutions and advantages of the disclosure, a detailed description of embodiments of the disclosure will be provided with reference to the accompanying drawings. It is noticed that the following description of embodiments is merely intended to interpret and illustrate a general concept of the disclosure, rather than being construed as a limitation of the disclosure. In the specification and drawings, same or similar reference numerals refer to same or similar components or members. For clarity, the drawings are not necessarily drawn to scale, and some known parts and structures may be omitted from the drawings.

Unless otherwise defined, the technical or scientific terms used in the disclosure shall be the general meaning understood by those with general skills in the field to which the disclosure belongs. Words of "First", "second" and similar words used in the present disclosure do not indicate any order, quantity or importance, but are only used to distinguish different components. The wording "one" or "one" does not exclude multiple. Wordings of "comprising" or "containing" and other similar words mean that the elements or objects appearing before the word cover the elements or objects appearing after the word and their equivalents, without excluding other elements or objects. Words like "connect" or "connect" are not limited to physical or mechanical connections, but can comprise electrical connections, whether direct or indirect. Expressions "Up", "down", "left", "right", "top" or "bottom" are only used to represent the relative position relationship. When the absolute position of the described object changes, the relative position relationship may also change accordingly. When an element such as a layer, film, region, or base substrate is referred to as being "up" or "down" on another element, the element may be "directly" on "or" down "on the other element, or there may be intermediate elements.

It is found by the applicant that an OLED display panel has a better display effect in a condition of a relatively dark ambient light; however, when the OLED display panel is used outdoors or in a condition of a relatively bright ambient light, it will exhibit/present a relatively strong reflected light, which is mainly because the metal electrodes in the OLED display have relatively strong reflection effect.

Since the metal electrodes in the OLED display panel have strong reflection effect, then, when users use OLED display panel in outdoor environment, they may fail to see the OLED display panel clearly. Upon using OLED display panel in a relatively bright environment, in order to make sure that the user see the picture clearly, the brightness of the screen has to be increased. Once the brightness is increased, a current passing through the OLED display panel will also be increased, and the aging of OLED display panel will in turn be accelerated, thus affecting the service life of devices of the OLED display panel. Therefore, it is necessary to provide a display panel that can adapt to use conditions of both strong ambient light and weak ambient light.

FIG. 1 illustrates a display panel 100a according to some embodiments of the present disclosure. The display panel 100a comprises a base substrate 10, and a plurality of sub-pixel units 20 and an electrochromic assembly 30 both disposed on the base substrate 10. The plurality of sub-pixel unit 20 comprises a plurality of light emitting portions 21, respectively. The plurality of light emitting portions 21 may for example be a plurality of light emitting diode devices, respectively, i.e., each of the plurality of light emitting portions comprises a cathode 22, an anode 23 and a light emitting material layer 24 between the cathode 22 and the anode 23. By way of example, each of the plurality of light emitting portions 21 may further comprise a hole injection layer, a hole transporting layer, an electron transporting layer, an electron injection layer and the like so as to improve light emitting efficiency. However, the embodiments of the present disclosure are not limited thereto, and each of the plurality of light emitting portions 21 may also adopt other known light emitting structures (such as known OLED light emitting structures). The electrochromic assembly 30 is located on a light emergent side of the plurality of light emitting portions 21. The electrochromic assembly 30 may specifically comprise a plurality of electrochromic portions 31. The plurality of electrochromic portions 31 are located on the light emergent side of respective ones of the plurality of light emitting portions 21 and cover (for example completely or partially cover) respective ones of the plurality of light emitting portions 21. Here, the electrochromic assembly 30 may function as a transmittance adjustment device, which may change the transmittance of the plurality of electrochromic portions 31 for at least a portion of ambient light passing therethrough depending on an incident intensity of ambient light. By way of example, the electrochromic assembly 30 may further comprise a first electrode 32 on one side of the plurality of electrochromic portions 21 facing the plurality of light emitting portions 31; and a second electrode 33 on the other side of the plurality of electrochromic portions 21 distal to the plurality of light emitting portions 31, respectively. The first electrode 32 and the second electrode 33 may be used to apply voltage(s) on both sides of the plurality of electrochromic portions 31 to control a change in respective colors of the plurality of electrochromic portions 31.

In the present disclosure, so-called "incident intensity of ambient light" refers to an intensity of ambient light incident on the display panel 100a, or an intensity of ambient light itself. Here, such an expression "incident intensity of ambient light" is intended to distinguish from an intensity of ambient light which exits the display panel after being reflected by metal electrodes of the display panel, the latter being referred to as "reflection intensity of ambient light".

While the display panel is displaying images thereon, ambient light which is incident onto and enters the display panel from the light emergent side of the plurality of light emitting portions 21 (i.e. a display side of the display panel) irradiates the metal electrodes (e.g., anodes 23 or cathode 22 of the plurality of light emitting portions 21) in the display panel and is reflected by the metal electrodes. Since the metal electrodes typically have relatively high reflectivity, then, in a condition that they are provided in a "high-light environment" (i.e., ambient light has a relatively high incident intensity), the intensity of reflected ambient light may be relatively strong in the absence of the electrochromic assembly 30, thus affecting the display effect of the display panel. However, in the embodiments of the present disclosure, since there is provided the electrochromic assembly 30 in the display panel, therefore, in a condition of relatively high incident intensity of ambient light, the transmittance of the plurality of electrochromic portions 31 in the electrochromic assembly 30 for ambient light may be reduced, such that the intensity of ambient light is attenuated after entering the display panel. As such, the intensity of the reflected ambient light exiting the display panel will be significantly reduced.

However, while the electrochromic assembly 30 attenuates ambient light, it may tend to inevitably attenuate the intensity of the light emitted from the plurality of light emitting portions 21 to some extent. Such an effect will not be apparently perceived in high-light environment, but it may result in a relatively weak emergent intensity of the display panel in a "low-light environment" (i.e., ambient light has a relatively low incident intensity) and in turn affect the display effect. Therefore, in a condition that ambient light has a relatively low incident intensity, the transmittance of the plurality of electrochromic portions 31 in the electrochromic assembly 30 for ambient light may be increased, such that the light which is actively emitted by the plurality of light emitting portions 21 of the display panel may not be excessively reduced, so as to ensure the display effect of the display panel and reduce the power consumption in the low-light environment.

In the embodiments of the present disclosure, in order to realize that the display panel may clearly display images both in the high-light environment and the low-light environment, for example, the transmittance of the electrochromic assembly 30 for ambient light and the incident intensity of ambient light may be set to be in an inverse function relationship with each other.

By way of example, in the display panel, the plurality of sub-pixel units 20 may be provided on the base substrate 10, each of which may comprise a respective one of the plurality of light emitting portion 21. Respective light emitting portions 21 of different sub-pixel units 20 may emit light of different colors. For example, by taking RGB display mode as an example, three sub-pixel units of red, green and blue may be provided in each pixel of the display panel. Accordingly, a respective light emitting portion 21 in the red sub-pixel unit emits red light, a respective light emitting portion 21 in the green sub-pixel unit emits green light, and a respective light emitting portion 21 in the blue sub-pixel unit emits blue light.

The operation principle of the electrochromic assembly 30 will be described in detail as follows:

In some embodiments, the plurality of electrochromic portions 31 are formed by an electrochromic material. When the voltage applied between the first electrode 32 and the second electrode 33 varies, the respective electrochromic portion 31 may be in two different states, i.e., a color rendering state and a transparent state. As to each of the plurality of electrochromic portions 31, a transmittance thereof in the color rendering state for light in the predetermined wavelength range is higher than a transmittance thereof in the color rendering state for light having wavelengths other than in the predetermined wavelength range, but is lower than a transmittance thereof in the transparent state for light in the predetermined wavelength range. By way of example, in the transparent state, the electrochromic portion 31 may be substantially transparent to light of various wavelength ranges. The color displayed by the electrochromic portion 31 in the color rendering state corresponds to the predetermined wavelength range. By modulating the voltage between the first electrode 32 and the second electrode 33, the state of the electrochromic portion 31 may be changed, thereby changing the transmittance thereof for ambient light passing through the electrochromic portion 31.

Figure 2:
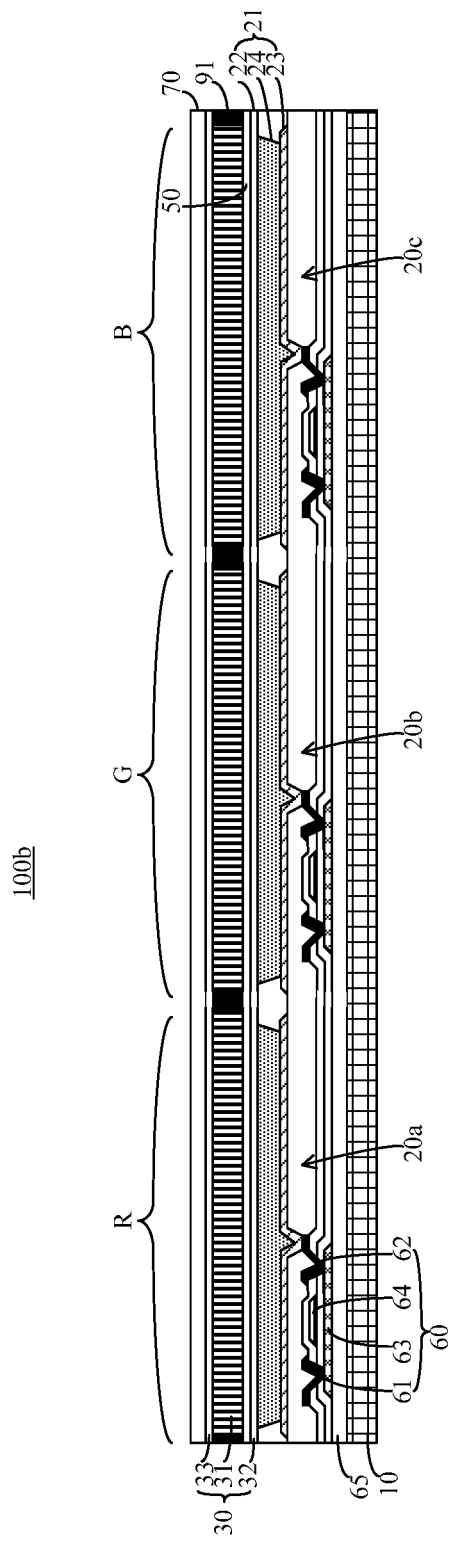
FIG. 2 illustrates a schematic structural view of a display panel according to another embodiment of the disclosure.

FIG. 2 illustrates a display panel 100b according to other embodiments of the present disclosure. Three types of sub-pixel units of different colors are illustrated in the display panel 100b according to the embodiments. Specific number of sub-pixel units in the embodiments of the present disclosure is not limited to three, for example, more sub-pixel units may also be provided. By way of example, upon consideration of the plurality of sub-pixel units of the display panel, the plurality of electrochromic portions 31 may be arranged in one-to-one correspondence with the plurality of light emitting units 21, and an orthographic projection of each of the plurality of the electrochromic portions 31 on the base substrate 10 overlaps with an orthographic projection of a respective one of the plurality of the light emitting portions 21 corresponding thereto on the base substrate 10. Since the metal electrodes which are capable of implementing a strong reflection of ambient light may be typically provided in the plurality of light emitting portions 21. Therefore, as such, the plurality of electrochromic portions 31 enable a better control on the transmittance thereof for ambient light directing towards the metal electrodes and for ambient light reflected by the metal electrodes.

Figure 3:
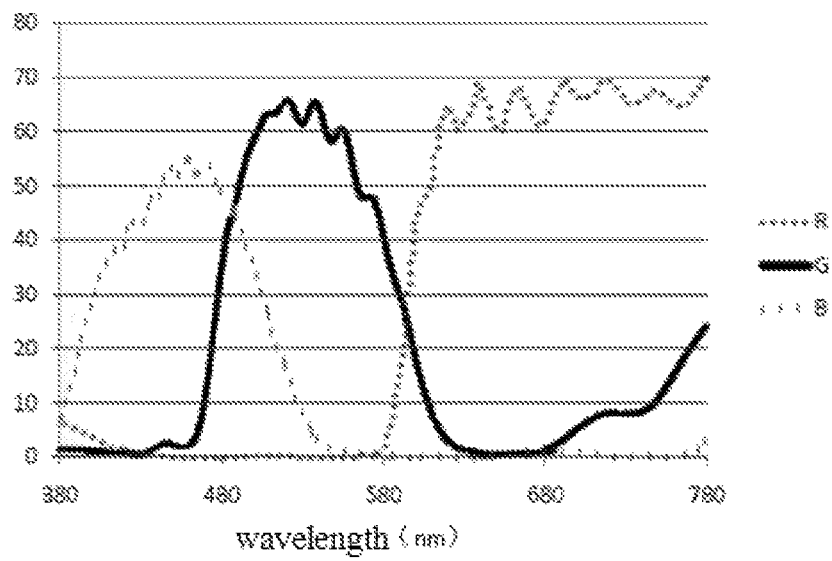
FIG. 3 illustrates a plot of transmittance curves of electrochromic materials for light in different wavelength ranges.

Specifically, FIG. 3 illustrates a plot of curves of transmittance (%) of an electrochromic material in the color rendering state for light in different wavelength ranges. It can be seen from the figure that, as to each of the three electrochromic materials, the transmittance thereof is higher for light in a respective predetermined wavelength range and is lower for light in other wavelength ranges. From the three curves labeled by R, G and B respectively in FIG. 3, it can be seen that, respective predetermined wavelength ranges corresponding to the three electrochromic materials exactly correspond to the red (R), green (G) and blue (B) colors of light, respectively. By way of example, the three electrochromic materials may be used corresponding to the light emitting portions of the red sub-pixel unit 20a, the green sub-pixel unit 20b, and the blue sub-pixel unit 20c as illustrated in FIG. 2, respectively. In other words, specific color(s) displayed by the plurality of electrochromic portion 31 in the color rendering state may be the same as specific color(s) of light emitted by respective ones of the plurality of light emitting portions 21 corresponding to the plurality of electrochromic portions 31.

The effect of the above embodiments will be explained, by taking an instance as below as an example, in which the electrochromic material (e.g., the electrochromic material corresponding to the curve R in FIG. 3) which may display red is used to cover the red sub-pixel unit 20a. When ambient light passes through the electrochromic material which displays red (in the color rendering state), the transmittance thereof for red light is much greater than that for light of other colors; and almost all light other than red light may fail to pass through the electrochromic material. It should be noted that, for the red sub-pixel unit, a portion of ambient light which interferes with the display effect is mainly light of other colors rather than the red light, and red light in ambient light may increase an overall brightness of the red sub-pixel, or may increase the intensity of red light emitted from the light emitting portions 21 of the red sub-pixel. Considering that the electrochromic material that displays red will inevitably reduce the intensity of red light emitted from the light emitting portion 21 of the red sub-pixel while reducing the transmittance thereof for the ambient light, and red light in the ambient light which passes through the electrochromic material may compensate the reduction of the intensity of red light emitted from the light emitting portion 21 of the red sub-pixel to some extent, facilitating enhancement of the display brightness of the red sub-pixel, which is advantageous for improving the display effect in the high-light environment. However, in the low-light environment, the electrochromic portion 31 may be adjusted into a transparent state. Then, the transmittance of the electrochromic portion 31 is greatly increased in such a transparent state than in the color rendering state, for light of various wavelengths comprising red light. Therefore, the reduction of intensity of red light emitted from the light emitting portion 21 of the red sub-pixel by the electrochromic portion 31 is also greatly weakened, which is advantageous for improving the display effect in the low-light environment.

Although the electrochromic material which may display red is taken as an example as above, electrochromic material(s) that may display other color(s) operates on the basis of similar principle, which will not be repeatedly discussed herein. By way of example, the electrochromic portion 31 which may display red (corresponding to the red sub-pixel unit 20a) may be an electrochromic material of 1,1'-disubstituted-4,4'-dipyridyl, the electrochromic portion 31 which may display green (corresponding to the green sub-pixel unit 20b) may be formed by an electrochromic material of $Rh_2O_3$, and the electrochromic portion 31 which may display blue (corresponding to the blue sub-pixel unit 20c) may be formed by an electrochromic material of $IrO_x$. However, embodiments of the present disclosure are not limited thereto, and other electrochromic materials known in the art may also be used to form electrochromic portion(s) 31.

By way of example, the display panels 100a, 100b according to the embodiment of the present disclosure may also comprise a controller 40. The controller 40 may be configured to modulate the electrochromic portion 31 into a color rendering state by applying a first voltage between the first electrode 32 and the second electrode 33 in response to an incident intensity of ambient light higher than a first threshold, and to modulate the electrochromic portion 31 into a transparent state by applying a second voltage between the first electrode 32 and the second electrode 33 in response to the incident intensity of ambient light lower than the first threshold. Aforementioned first threshold may be selected as required. Further, in some examples, the controller 40 is further configured to modulate the electrochromic portion 31 into different color rendering states respectively by applying apply different voltages between the first electrode 32 and the second electrode 33 depending on different incident intensities of ambient light. In different color rendering states, the electrochromic portion 31 has different transmittance for light of a predetermined wavelength range (such as red light, green light or blue light). As such, it may further improve the adaptability of the display panel to different incident intensities of ambient light.

As illustrated in FIG. 1, each sub-pixel unit 20 may further comprise a controllable switching device (e.g., TFT (thin film transistor)) 60 configured to control light output of the light emitting portion 21. For example, the controllable switching device 60 may comprise some parts such as a source 61, a drain 62, a gate 63 and an active layer 64 and the like. In some examples, a buffer layer 65 for isolation may further be provided between the base substrate 10 and the controllable switching device 60. By way of example, the display panel 100a may also comprise an insulating protective layer 50 (for example, it may be formed by silicon nitride and configured to protect a light emitting material in the light emitting portion 21), which is located between the cathode 22 and the electrochromic portion 31 of the light emitting portion 21. By way of example, a sealing layer 70 may also be provided on a side of the electrochromic assembly 30 distal to the base substrate 10 and configured to protect the electrochromic assembly 30.

Figure 4:
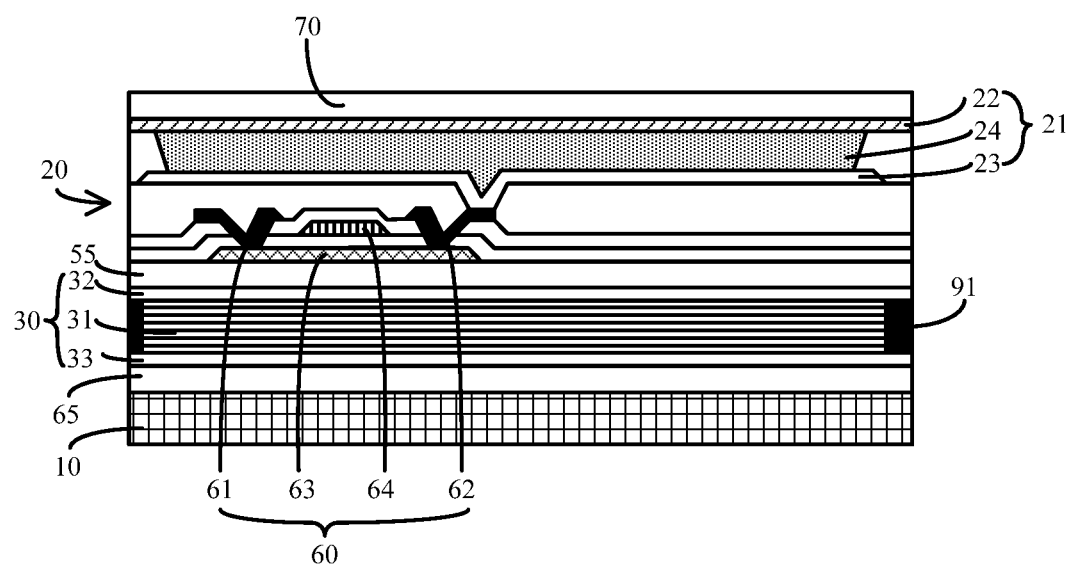
FIG. 4 illustrates a schematic structural view of a display panel according to yet another embodiment of the disclosure.

In the embodiment of FIG. 1, it is shown a condition in which the light emitting portions 21 (for example, OLED) is of a top emission type, while in the embodiment of FIG. 4, it is shown a condition in which the light emitting portions 21 is of a bottom emission type. In the embodiment of FIG. 1, the electrochromic assembly 30 in the display panel 100a is located on a side of the light emitting portions 21 distal to the base substrate 10, the anode 23 in the light emitting portions 21 is a metal electrode, and the cathode 22 is a transparent electrode; while in the embodiment of FIG. 4, the electrochromic assembly 30 in the display panel 100c is located between the light emitting portion 21 and the base substrate 10, the cathode 22 in the light emitting portions 21 is a metal electrode, and the anode 23 in the light emitting portions 21 is a transparent electrode. By way of example, the light emitting portions 21 and the electrochromic assembly 30 may be separated by an insulating layer 55 interposed therebetween. In the case where the emitting portion 21 of top emission type is adopted as illustrated in FIG. 1, the first electrode 32 of the electrochromic assembly 30 may be the same electrode as the cathode 22 in the light emitting portion 21, facilitating saving in processes.

Figure 5:
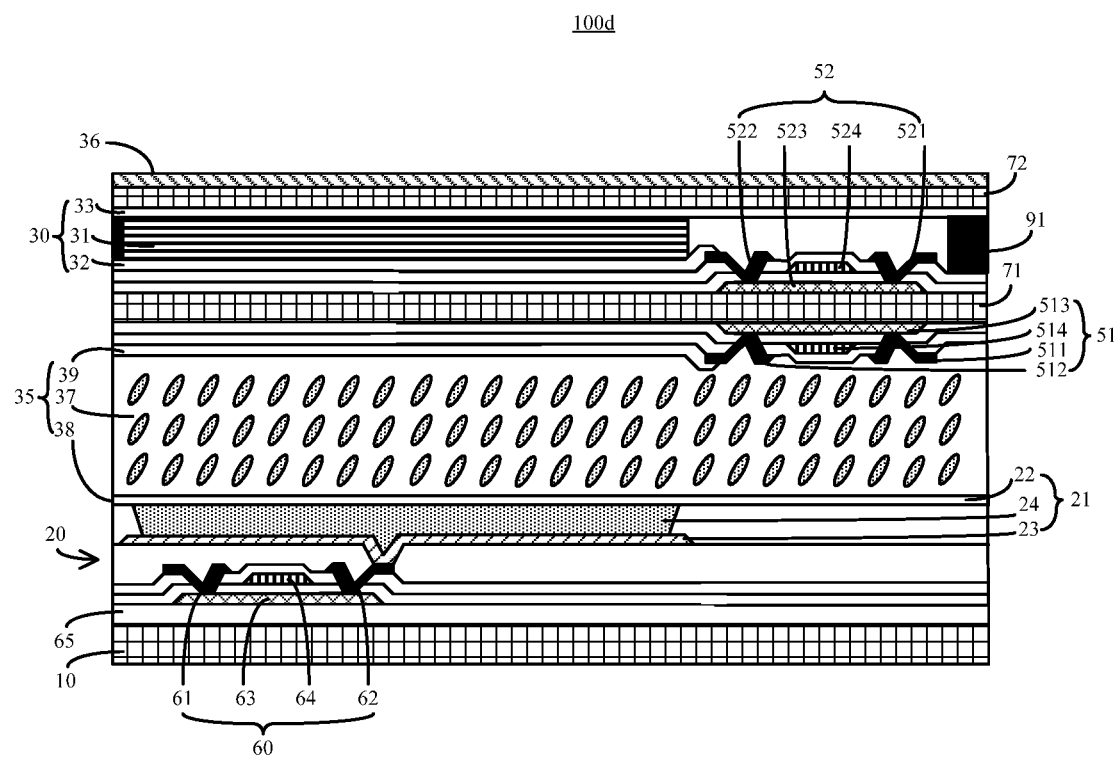
FIG. 5 illustrates a schematic structural view of a display panel according to still another embodiment of the disclosure.
Figure 7:
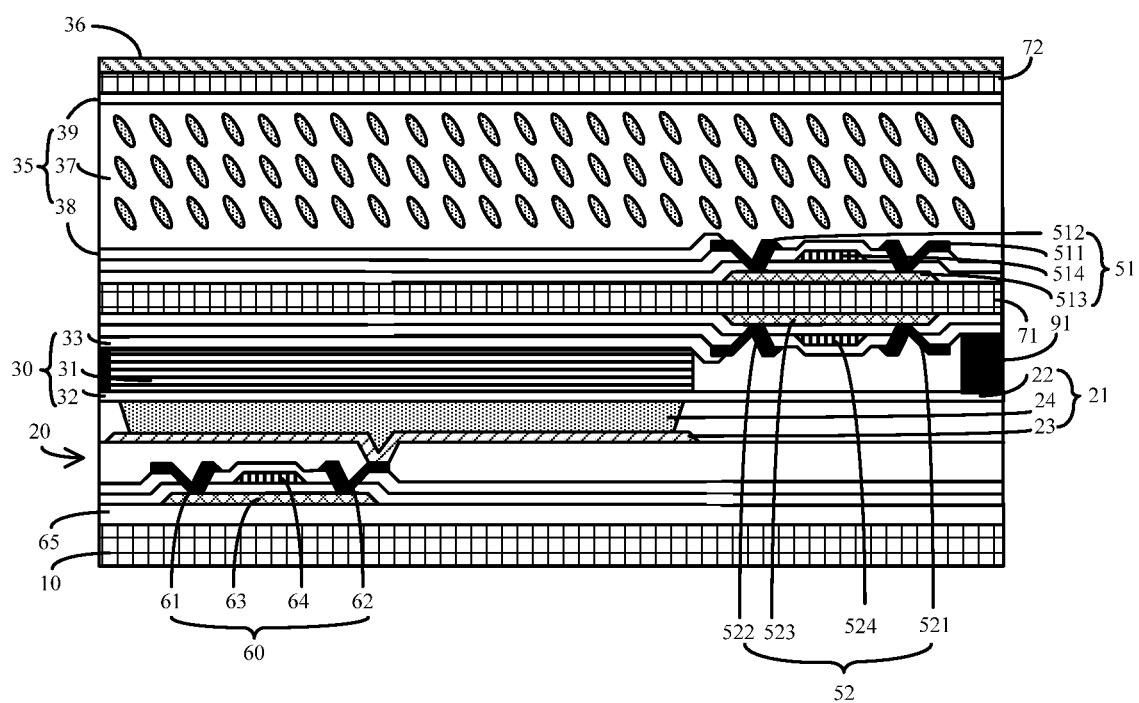
FIG. 7 illustrates a schematic structural view of a display panel according to yet once more embodiment of the disclosure.

FIG. 5 illustrates a schematic structural view of a display panel 100d according to further embodiments of the present disclosure. As compared with the embodiment illustrated in FIG. 1, the display panel 100d further comprises a liquid crystal adjustment assembly 35 and a circular polarizer 36. The liquid crystal adjustment assembly 35 is located between the electrochromic assembly 30 and the light emitting portion 21. The circular polarizer 36 is located on a side of one of the electrochromic assembly 30 and the liquid crystal adjustment assembly 35 which is more distal to the light emitting portion 21 than the other, which side is distal to the light emitting portion 21. In the example of FIG. 5, the electrochromic assembly 30 is more distal to the light emitting portion 21 than the liquid crystal adjustment assembly 35, and the circular polarizer 36 is located on a side of the electrochromic assembly 30 distal to the light emitting portion 21. In other examples, for example as illustrated in FIG. 7, the liquid crystal adjustment assembly 35 is more distal to the light emitting portions 21 than the electrochromic assembly 30, and the circularly polarizer 36 may be located on a side of the liquid crystal adjustment assembly 35 distal to the light emitting portions 21. By way of example, the liquid crystal adjustment assembly 35 may comprise a liquid crystal layer 37; and a third electrode 38 and a fourth electrode 39 on both sides of the liquid crystal layer 37 respectively. The third electrode 38 is located on one side of the liquid crystal layer 37 facing the light emitting portions 21, and the fourth electrode 39 is located on the other side of the liquid crystal layer 37 distal to the light emitting portions 21. By way of example, as illustrated in FIG. 5, a first additional substrate 71 (e.g., a glass substrate) may be provided between the liquid crystal adjustment assembly 35 and the electrochromic assembly 30, while a second additional substrate 72 (e.g., a glass substrate) may be provided between the circular polarizer 36 and the electrochromic assembly 30. The first additional substrate 71 and the second additional substrate 72 may play a supporting and protecting role respectively. However, embodiments of the present disclosure are not limited thereto, for example, the first additional substrate 71 and the second additional substrate 72 may be replaced by transparent insulating layers respectively. In the example of FIG. 5, the third electrode 38 may be set as the same electrode as the cathode 22 of the light emitting portion 21 so as to simplify the processes. Certainly, the third electrode 38 and the cathode 22 may also be provided respectively.

Figure 11:
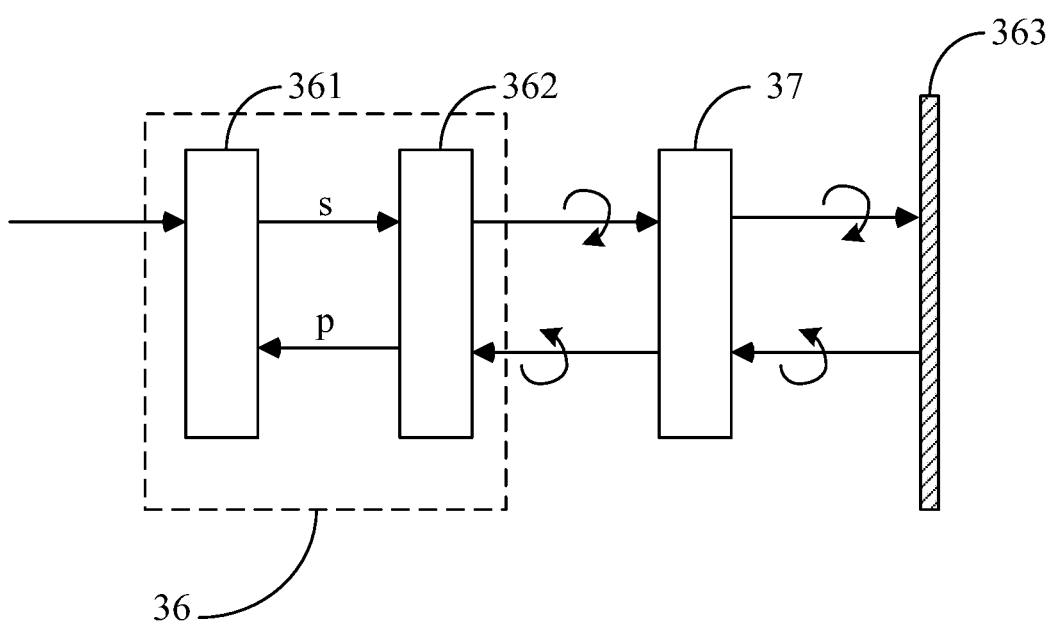
FIG. 11 and FIG. 12 illustrate operation principles of a liquid crystal adjustment assembly and a circular polarizer.

The operation principles of the liquid crystal adjustment assembly 35 and the circular polarizer 36 are described below with reference to FIGS. 11 and 12.

The circular polarizer 36 is an optical component that may modulate incident light into circularly polarized light. Typically, the circular polarizer 36 may be composed of a linear polarizer 361 and a quarter wave plate 362. As shown in FIG. 11, ambient light converts to linearly polarized light after passing through the linearly polarizer 361, with a polarization direction of the linearly polarized light (represented by "s" in the figure) being the same as an light transmission axis of the linearly polarizer 361; and after the linearly polarized light continues to pass through the quarter wave plate 362, it converts to circularly polarized light (e.g., right-handed circularly polarized light). It is assumed that the liquid crystal layer 37 in the liquid crystal adjustment assembly 35 is in a first state in which the liquid crystal layer 37 does not change the polarization state of the circularly polarized light, then the circularly polarized light will maintain its original polarization state after passing through the liquid crystal layer 37, but the circularly polarized light will change its rotation direction after being reflected by the metal electrode 363 (for example, the circularly polarized light will convert from right-handed circularly polarized light to left-handed circularly polarized light), and the circularly polarized light whose rotation direction is changed will be reflected back and then pass through the quarter wave plate 362 once again so as to convert to linearly polarized light (represented by "p" in the figure) having its polarization direction perpendicular to the light transmission axis of the linearly polarizer 361, and thus the linearly polarized light may not pass through the linearly polarizer 361. As such, the circular polarizer 36 may reduce or inhibit the emission intensity of ambient light from the display panel after being reflected.

Figure 12:
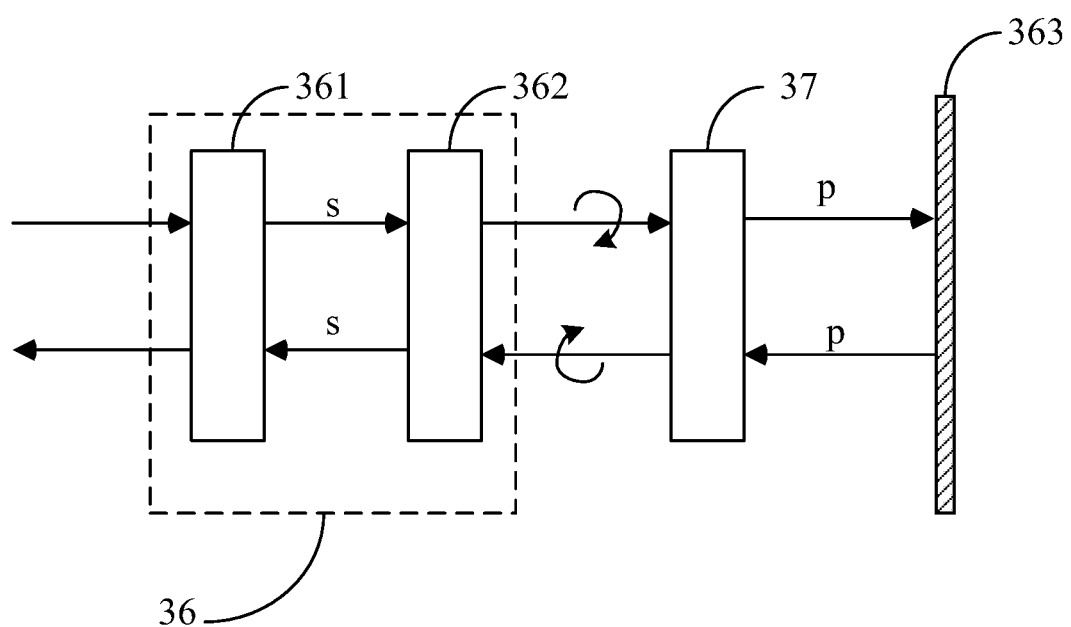

FIG. 12 illustrates a condition where the liquid crystal layer 37 in the liquid crystal adjustment assembly 35 is in a second state, in which the liquid crystal layer 37 will change the polarization state of ambient light passing therethrough such that, an emission ratio of ambient light from the circular polarizer 36 (i.e., the ratio of the emergent intensity of ambient light from the circular polarizer 36 to the incident intensity of ambient light) is higher in the second state than in the first state of the liquid crystal layer 37. Specifically, as previously described, the light irradiating the liquid crystal layer 37 through the circular polarizer 36 is circularly polarized light (e.g., left-handed circularly polarized light). By way of example, assuming that the liquid crystal layer 37 in the second state has the same properties as a quarter wave plate, then the circularly polarized light will be converted by the liquid crystal layer 37 into a linearly polarized light whose polarization direction is perpendicular to the light transmission axis of the linearly polarizer 361, and the linearly polarized light is reflected by the metal electrode 363 and then pass through the liquid crystal layer 37 once again so as to convert to circularly polarized light which has the same rotation direction (e.g., the left-handed circularly polarized light) as that of the circularly polarized light previously incident on the liquid crystal layer 37; and the circularly polarized light passes through the quarter wave plate 362 once again and then converts to linearly polarized light whose polarization direction which is parallel to the light transmission axis of the linearly polarized light plate 361. Then, the linearly polarized light may exit the linearly polarizer 361. The expression "the liquid crystal layer 37 in the second state has the same properties as a quarter wave plate" as in the present disclosure means that the effect of liquid crystal layer 37 in the second state on the polarization state of linearly or circularly polarized light is the same as that of one quarter wave plate on the polarization state of linearly or circularly polarized light, for example, the liquid crystal layer 37 in the second state may function like quarter wave plate, i.e., the linearly polarized light passing therethrough is converted thereby into circularly polarized light with the same rotation direction, or the circularly polarized light passing therethrough is converted thereby into linearly polarized light with the same polarization direction.

It should be noted that, in the embodiment of the present disclosure, the structure of the circular polarizer 36 may not be limited to being composed of the linear polarizer 361 and the quarter wave plate 362, for example, the circular polarizer 36 may also be composed of the linear polarizer, a half wave plate and the quarter wave plate, or have other structures known in the art.

In conclusion, when the liquid crystal layer 37 is in the first state, ambient light incident on and entering the display panel 100d will be blocked by the circular polarizer 36 and thus fail to exit the display panel 100d; however, when the liquid crystal layer 37 is in the second state, at least a portion of ambient light incident on and entering the display panel 100d will pass through the circular polarizer 36 and exit the display panel 100d. That is to say, for ambient light, the emergent light intensity of the display panel 100d when the liquid crystal layer 37 is in the second state will be significantly greater than that of the display panel 100d when the liquid crystal layer 37 is in the first state. Ideally, when the liquid crystal layer 37 is in the first state, ambient light incident on and entering the display panel 100d will be completely blocked by the circular polarizer 36 and thus fail to exit the display panel 100d. However, the embodiment of the present disclosure may not be limited thereto. For example, when the liquid crystal layer 37 is in the first state, a portion (for example, 50% to 60%) of ambient light incident on and entering the display panel 100d may also be blocked by the circular polarizer 36 and thus fail to exit the display panel 100d.

Therefore, the liquid crystal layer 37 may be in the first state in the condition of relatively strong ambient light, and may be in the second state in the condition of the condition of weak ambient light, so as to further improve the adaptability of the display panel 100d to both relatively strong ambient light and relatively weak ambient light.

By way of example, the display panel 100d may also comprise a controller 40. The controller 40 may be configured to modulate the liquid crystal layer 37 into the first state by applying a third voltage between the third electrode 38 and the fourth electrode 39 in response to an incident intensity of ambient light higher than a second threshold, and to modulate the liquid crystal layer 37 into the second state by applying a fourth voltage between the third electrode 38 and the fourth electrode 39 in response to an incident intensity of ambient light lower than the second threshold. As to the liquid crystal layer 37, an polarization state of ambient light passing therethrough remains as original in the first state, but is changed thereby in the second state to an extent that an emission ratio of ambient light from the circular polarizer 36 is higher in the second state than in the first state. By way of example, the controller 40 may also be used to control the electrochromic assembly 30, that is, to apply a first voltage between the first electrode 32 and the second electrode 33 in response to the incident intensity of ambient light higher than the first threshold to modulate the electrochromic portion 31 into the color rendering state, and to apply a second voltage between the first electrode 32 and the second electrode 33 in response to the incident intensity of ambient light lower than the first threshold to modulate the electrochromic portion 31 into the transparent state. The first threshold for the electrochromic assembly 30 and the second threshold for the liquid crystal adjustment assembly 35 may be the same or different. By way of example, one and the same controller 40 may be used to control the electrochromic assembly 30 and the liquid crystal adjustment assembly 35. Alternatively, different controllers may be used individually to control the electrochromic assembly 30 and the liquid crystal adjustment assembly 35 respectively.

By way of example, in order to implement a better control on voltage(s) on both sides of the liquid crystal layer 37, the liquid crystal adjustment assembly 35 may further comprise a first controllable switching device 51, e.g., a TFT (thin film transistor) device. For example, the first controllable switching device 51 may comprise a source 511, a drain 512, a gate 513, an active layer 514 and the like. The first controllable switching device 51 may be configured to apply a potential onto or remove a potential from the third electrode 38 or the fourth electrode 39. In order to realize a better control on the liquid crystal adjustment assembly 35, a plurality of first controllable switching devices 51 may be provided to control change in the transmittance of ambient light for different sub-pixel units 20 respectively. Of course, voltage(s) on both sides of the entire liquid crystal layer 37 in the display panel may also be controlled by a single first controllable switching device 51.

Similarly, by way of example, in order to implement a better control on the electrochromic portion 31, the electrochromic assembly 30 may further comprise a second controllable switching device 52, e.g., a TFT (thin film transistor) device. For example, the second controllable switching device 52 may comprise a source 521, a drain 522, a gate 523, an active layer 524 and the like. The second controllable switching device 52 may be configured to apply a potential onto or remove a potential from the first electrode 32 or the second electrode 33. In order to realize a better control on the electrochromic assembly 30, a plurality of second controllable switching devices 52 may be provided, for example, a second controllable switching device 52 may be respectively provided for each photochromic portion 31, so as to control each photochromic portion 31 separately.

Figure 6:
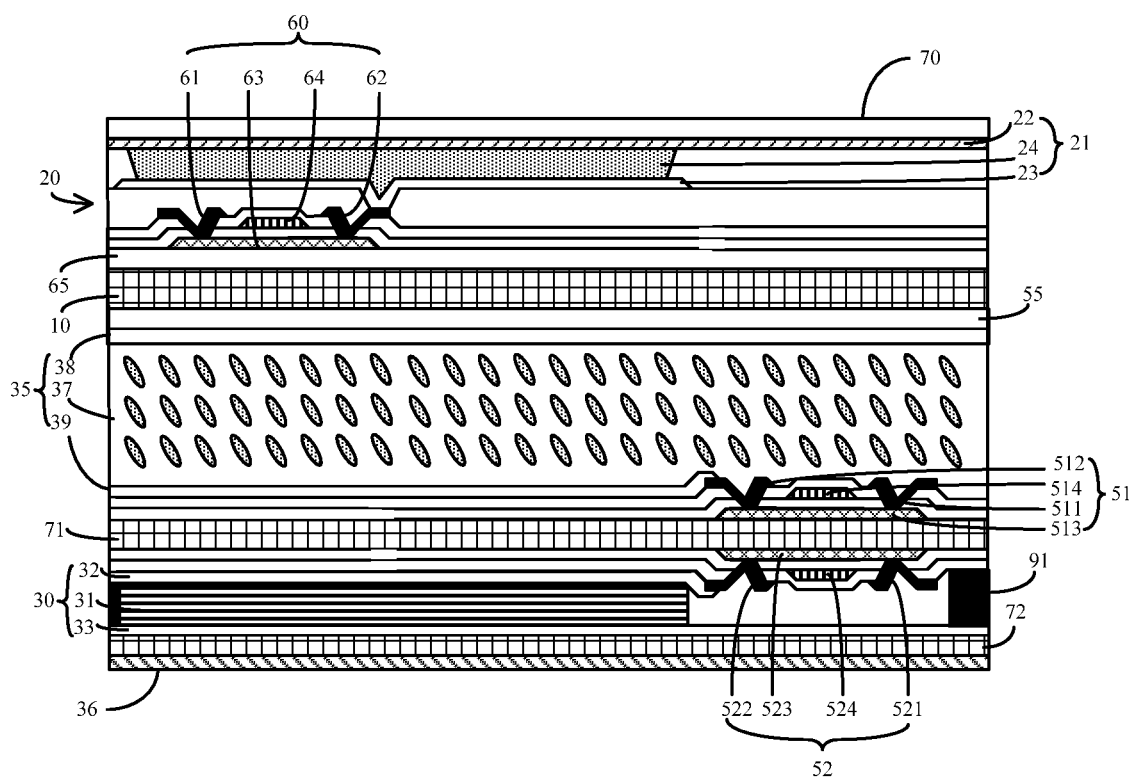
FIG. 6 illustrates a schematic structural view of a display panel according to still yet another embodiment of the disclosure.

In the embodiment of FIG. 5, it is illustrated that the light emitting portions 21 (for example, OLED) is of the top emission type; while in the embodiment of FIG. 6, it is illustrated that the light emitting portions 21 is of the bottom emission type. In the embodiment of FIG. 5, both the electrochromic assembly 30 and the liquid crystal adjustment assembly 35 in the display panel 100d are located on the side of the light emitting portions 21 distal to the base substrate 10, the anode 23 in the light emitting portions 21 is a metal electrode and the cathode 22 in the light emitting portions 21 is a transparent electrode; while in the embodiment of FIG. 6, both the electrochromic assembly 30 and the liquid crystal adjustment assembly 35 in the display panel 100e are located on the other side of the substrate 10 opposite to the light emitting portions 21, the cathode 22 in the light emitting portions 21 is a metal electrode and the anode 23 in the light emitting portions 21 is a transparent electrode. In the embodiment illustrated in FIG. 6, a first additional substrate 71 may be provided between the electrochromic assembly 30 and the liquid crystal adjustment assembly 35, and a second additional substrate 72 may be provided between the electrochromic assembly 30 and the circular polarizer 36 for supporting the electrochromic assembly 30 and the liquid crystal adjustment assembly 35. Optionally, the first additional substrate 71 and the second additional substrate 72 may also be replaced by transparent insulating film layers respectively. In the case where the light emitting portion 21 of top emission type is adopted as illustrated in FIG. 5, the third electrode 38 of the liquid crystal adjustment assembly 35 may be the same electrode as the cathode 22 in the light emitting portion 21, facilitating saving in processes.

FIG. 7 illustrates a schematic structural view of a display panel 100f according to another embodiment of the present disclosure. As compared with the exemplary display panel 100d shown in FIG. 5, the display panel 100f shown in FIG. 7 is different therefrom, in that the liquid crystal adjustment assembly 35 is provided on the side of the electrochromic assembly 30 distal to the light emitting portions 21, while in the display panel 100d shown in FIG. 5, the liquid crystal adjustment assembly 35 is provided between the electrochromic assembly 30 and the light emitting portions 21. In the display panel 100f shown in FIG. 7, the first electrode 32 of the electrochromic assembly 30 may also be the same electrode as the cathode 22 in the light emitting portion 21, also facilitating saving in processes.

By way of example, in any of the above embodiments, the electrochromic assembly 30 and the liquid crystal adjustment assembly 35 may be spaced apart from each other by a transparent insulating film or an insulating substrate interposed therebetween. By way of example, the electrochromic assembly 30 also comprises light shielding portion 91 located between any two adjacent electrochromic portions 31. The light shielding portion 91 may prevent mutual interference between adjacent electrochromic portions 31, for example, it may be formed by black matrix.

Figure 10:
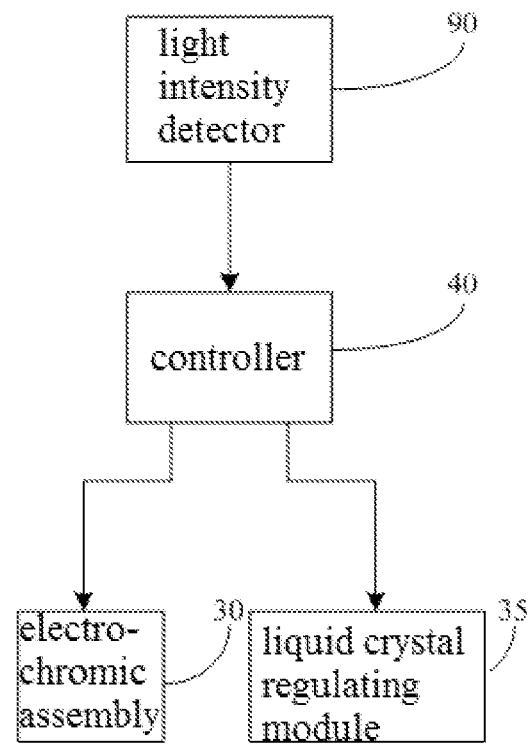
FIG. 10 illustrates a diagram of control modules of a display panel according to an embodiment of the disclosure.

In embodiments of the present disclosure, the display panels 100a, 100b, 100c, 100d, and 100f may also comprise a light intensity detector 90. The light intensity detector 90 is configured to detect the incident intensity of ambient light. The light intensity detector 90 may be any light intensity detection device known in the art. FIG. 10 shows a diagram of control modules of a display panel according to an embodiment of the present disclosure. By way of example, the light intensity detector 90 may provide the controller 40 with a data signal of the incident intensity of ambient light. The controller 40 may perform the above control operation on the electrochromic assembly 30 and the liquid crystal adjustment assembly 35 according to the data signal from the light intensity detector 90. The controller 40 may comprise, for example, a processor and A memory. By way of example, the controller 40 may control the voltage between the first electrode 32 and the second electrode 33 in the electrochromic assembly 30 based on the first threshold as described previously mentioned, or continuously control the voltage between the first electrode 32 and the second electrode 33 based on the change in the incident light intensity of ambient light. Similarly, the controller 40 may also control the voltage between the third electrode 38 and the fourth electrode 39 in the liquid crystal regulating module 35 based on the second threshold as described previously, or continuously control the voltage between the third electrode 38 and the fourth electrode 39 based on the change in the incident light intensity of ambient light.

Figure 8:
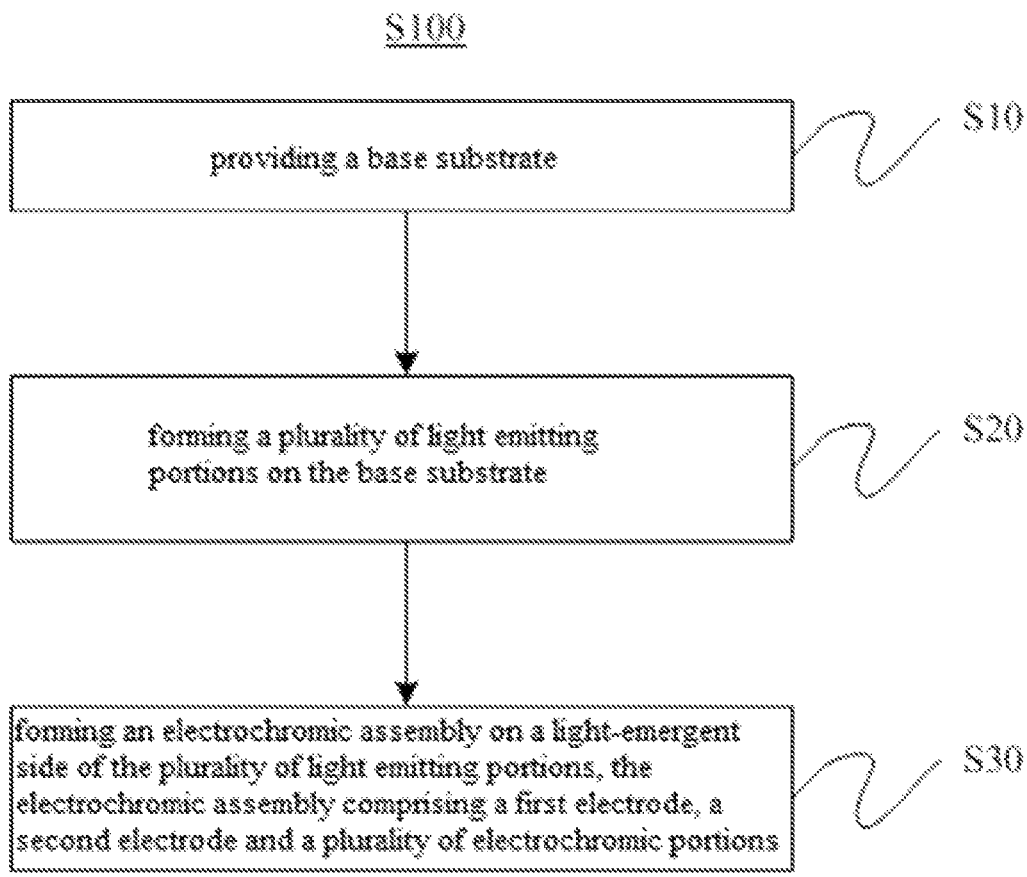
FIG. 8 illustrates an exemplary flow chart of a method for preparing a display panel according to an embodiment of the disclosure.

In the embodiment of the present disclosure, a method for preparing a display panel is further provided. As shown in FIG. 8, the method S100 for preparing a display panel may comprise:

Step S10: providing a base substrate;

Step S20: forming a plurality of light emitting portions on the base substrate; and Step S30: forming an electrochromic assembly on a light-emergent side of the plurality of light emitting portions, the electrochromic assembly comprising a first electrode, a second electrode and a plurality of electrochromic portions covering the plurality of light emitting portions, respectively.

It should be noted that, above steps S20 and S30 are not specifically in order. For example, when the top emission OLED is adopted by the light emitting portions 21, the light emergent side of the light emitting portions 21 is the side of the light emitting portions 21 distal to the base substrate, so step S20 may be executed first to form the plurality of light emitting portions 21, and then step S30 may be executed to form the electrochromic assembly 30; however, when the bottom emission OLED is adopted by the light emitting portions 21, the electrochromic assembly 30 may be formed between the light emitting portions 21 and the base substrate 10, and in such a condition, step S30 may also be executed first to form the electrochromic assembly 30, and then step S20 may be executed to form the plurality of light emitting units 21. Embodiments of the present disclosure are not limited thereto, and it is also possible to form the plurality of light emitting portions 21 and the electrochromic assembly 30 in other ways.

Figure 9:
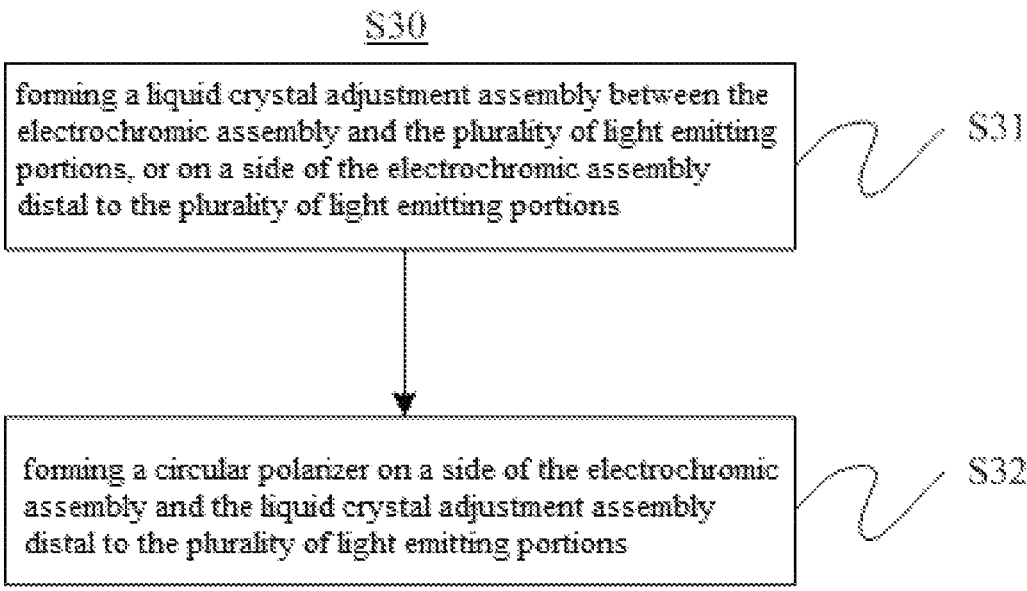
FIG. 9 illustrates a schematic flow chart of a step S30 in the method as illustrated in FIG. 8.

By way of example, as shown in FIG. 9, the above step S30 may also comprise:

Step S31: forming a liquid crystal adjustment assembly between the electrochromic assembly and the plurality of light emitting portions, or on a side of the electrochromic assembly distal to the plurality of light emitting portions; and Step S32: forming a circular polarizer on a side of one of the electrochromic assembly and the liquid crystal adjustment assembly which is more distal to the plurality of light emitting portions than the other, which side is distal to the plurality of light emitting portions.

Next, the exemplary display panel 100d shown in FIG. 5 is taken as an example to briefly describe specific exemplary processes.

On the base substrate (e.g., glass substrate) 10, various film layers of the thin film transistor may be prepared by a conventional LTPS (low temperature poly-silicon) technology, in which a layer of amorphous silicon is produced above all, and then the amorphous silicon is transformed into polycrystalline silicon by laser scanning at an elevated temperature for a short period, and then the polycrystalline silicon layer is patterned by a masking process. Then, a gate insulation layer is formed generally by silicon oxide. Then, a gate metal layer is prepared above the gate insulation layer, and the gate metal layer is then patterned by a masking process and an etching process. Then, an insulating spacer layer is made, and through-holes of source-drain metal are formed above the spacer layer by a masking and an etching process. Then, a film-forming and patterning of the source-drain metal layer are carried out. Next, a planarization is performed thereon, and through-hole of anode is formed through which the anode 23 of the light emitting portion 21 may be electrically connected with the drain of TFT, so as to implement driving of the anode of the light emitting portions 21 (OLED).

Then, a preparation of a light emitting material layer in the light emitting portions starts. A relatively thick resin layer is formed above the anode metal layer, and the light emitting material is positioned by a masking process. Then, a directional evaporation of the light emitting material layer 24 is carried out, and the light emitting material layer 24 is made to be in contact with the anode 23 in a notch or gap in the resin layer. Then, a film forming process of the cathode 22 is carried out, such that preparation of film layers on the substrate 10 is finished.

Subsequently, a preparation of film layer(s) on the first additional (e.g. glass) substrate 71 is carried out, and a poly-silicon layer, a gate insulating layer, a gate metal layer, an insulating spacer, a source-drain metal layer are respectively prepared on both sides of the first additional substrate 71 respectively, such that the second controllable switching device 52 (e.g. TFT device) and the first controllable switching device 51 (e.g., TFT device) are formed on both sides of the first additional substrate 71, respectively. The first electrode 32 and the fourth electrode 39 are respectively formed on both sides of the first additional substrate 71 (in this example, the third electrode 38 of the liquid crystal adjustment assembly 35 is the cathode 22 of the light emitting portions 21, which is not required to be prepared separately).

Then, a preparation of film layers on the second additional (e.g. glass) substrate 72 is carried out, and a second electrode 33 and an electrochromic portion 31 are prepared on the second additional substrate 72, and a light shielding portion 91 (e.g. formed by black light shielding material) is formed between adjacent electrochromic portions 31. Then, a process of alignment and is carried out by dripping liquid crystals onto a completed base substrate, and then accurately aligning the first additional substrate 71 on the base substrate 10, as shown in FIG. 5, with a liquid crystal layer 37 being sandwiched between the two substrates. Then, on the basis of the completion of the alignment of the base substrate 10 and the first additional substrate 71, an alignment operation of the second additional substrate 72 is performed. In the alignment operation of the second additional substrate 72, the second additional substrate 72 formed with the second electrode 33, the electrochromic portion 31 and the light shielding portion 91 is aligned with the first additional substrate 71 formed with the second controllable switching device 52 and the first electrode 32, in particular by aligning the corresponding positions of the electrochromic portion 31 and the first electrode 32. Then, a circular polarizer 36 is provided on the second additional substrate 72 (for example, the circular polarizer 36 is bonded on the second additional substrate 72 with an adhesive).

Figure 13:
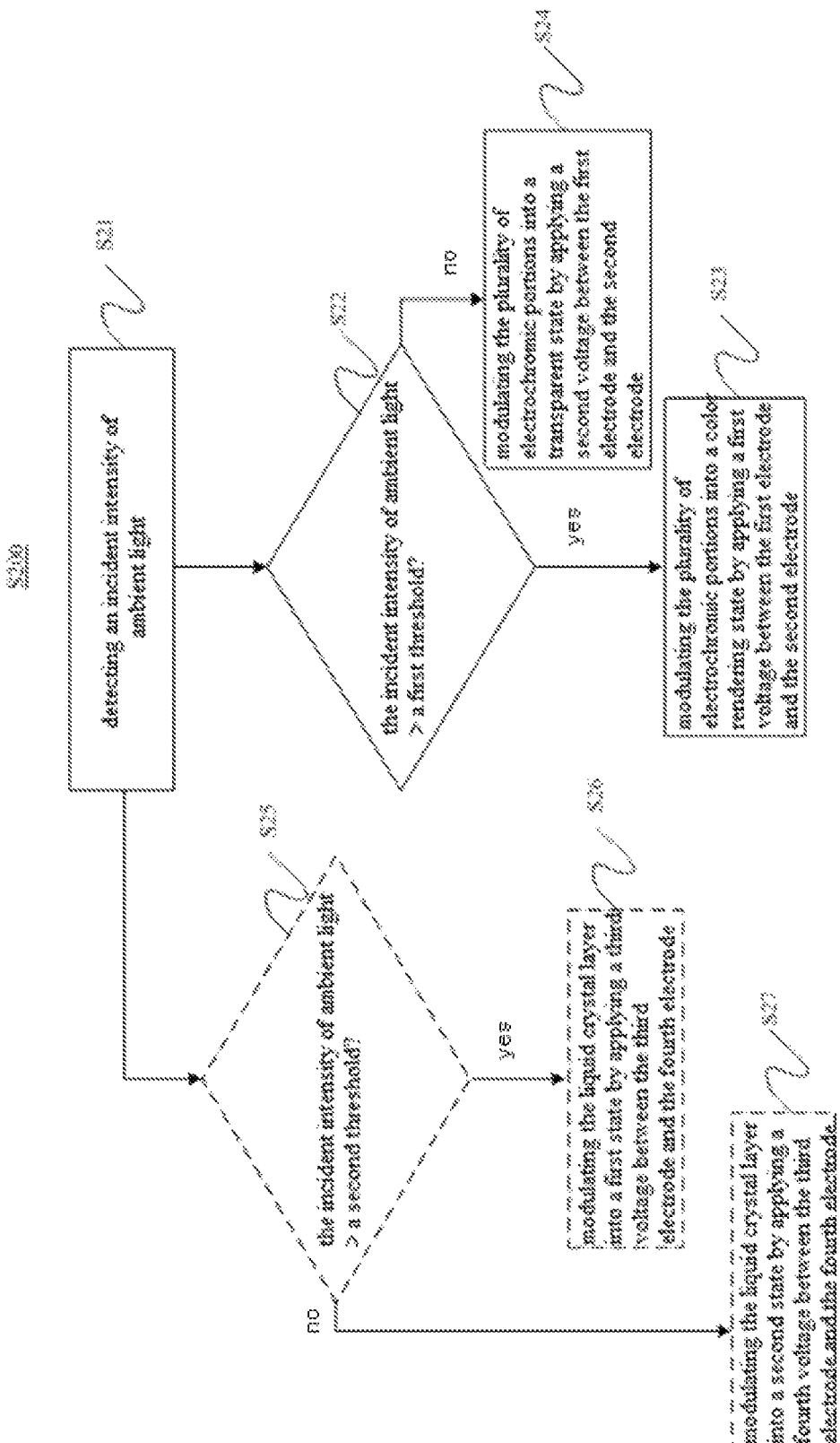
FIG. 13 illustrates a flow chart of a method for adjusting an intensity of reflected ambient light at the display panel according to an embodiment of the present disclosure.

In the embodiment of the present disclosure, a method for adjusting an intensity of ambient light reflected on the display panel as described above is also provided. As shown in FIG. 13, the method comprises:

Step S21: detecting an incident intensity of ambient light;

Step S22: comparing the incident intensity of ambient light as detected, with a first threshold;

Step S23: modulating the plurality of electrochromic portions into a color rendering state by applying a first voltage between the first electrode and the second electrode in response to the incident intensity of ambient light which is higher than the first threshold;

Step S24: modulating the plurality of electrochromic portions into a transparent state by applying a second voltage between the first electrode and the second electrode in response to the incident intensity of ambient light which is lower than the first threshold.

As to each of the plurality of electrochromic portions, a transmittance thereof in the color rendering state for light in the predetermined wavelength range is higher than a transmittance thereof in the color rendering state for light having wavelengths other than in the predetermined wavelength range, but is lower than a transmittance thereof in the transparent state for light in the predetermined wavelength range. Therefore, in a condition that the incident intensity of ambient light is greater than the first threshold, the transmittance of the electrochromic portion for ambient light is relatively lower, which will inhibit the reflection ratio of the display panel for ambient light; however, in a condition that the incident intensity of ambient light is less than the first threshold, the transmittance of the electrochromic portion for ambient light is relatively higher, which will improve the reflection ratio of the display panel for ambient light (as compared with a condition in which the electrochromic portion is in the color rendering state). This way makes it possible to obtain a more suitable reflection intensity of ambient light whether in high-light environment or low-light environment.

By way of example, as illustrated in the dotted box in FIG. 13, in the case that the display panel also comprises the liquid crystal adjustment assembly 35 and the circular polarizer 36, the method for adjusting an intensity of ambient light reflected on the display panel may also comprise:

Step S25: comparing the incident intensity of ambient light as detected, with a second threshold;

Step S26: modulating the liquid crystal layer into a first state by applying a third voltage between the third electrode and the fourth electrode in response to the incident intensity of ambient light which is higher than the second threshold;

Step S27: modulating the liquid crystal layer into a second state by applying a fourth voltage between the third electrode and the fourth electrode in response to the incident intensity of ambient light which is lower than the second threshold.

As to the liquid crystal layer, a polarization state of ambient light passing therethrough remains as original in the first state, but is changed thereby in the second state to an extent that an emission ratio of ambient light from the circular polarizer is higher in the second state than in the first state. Then, in a condition that the incident intensity of ambient light is greater than the second threshold, the transmittance of the circular polarizer 36 for ambient light is relatively low, which will inhibit the reflection ratio of the display panel for ambient light; however, in a condition that the incident intensity of ambient light is less than the second threshold, the transmittance of the circular polarizer 36 for ambient light is relatively high, which will improve the reflection ratio of the display panel for ambient light (as compared with a condition in which the liquid crystal adjusting module 35 in the first state).

It should be noted that, as shown in FIG. 13, the above two sets of steps, i.e., steps S22 to S24 and steps S25 to S27, may be carried out in parallel or serially. By way of example, the first threshold and the second threshold may be the same or different. In a condition that the first threshold and the second threshold are the same, step S22 and step S25 may be one and the same step.

In the disclosure, the display panel is an OLED display panel. For the purpose of explanation, those skilled in the art may understand that the display panel can also be other electroluminescent display panels, such as PLED (polymer electroluminescent display) panel, micro LED display panel, and the like.

Some block diagrams and/or flow charts are shown in the accompanying drawings. It should be understood that some of the blocks or combinations thereof in block diagrams and/or flow diagrams may be implemented by computer program instructions. These computer program instructions can be provided to a processor of a general-purpose computer, a special-purpose computer, or other programmable data processing device, so that when executed by the processor, these instructions can create devices for implementing the functions/operations described in these block diagrams and/or flow charts.

Therefore, the technology of the present disclosure may be implemented in the form of hardware and/or software (comprising firmware, microcode, and the like). In addition, the technology of the present disclosure may take the form of a computer program product on a computer-readable medium in which instructions are stored, which may be used by an instruction execution system (e.g., one or more processors) or in combination with an instruction execution system. In the context of the present disclosure, a computer-readable medium may be any medium capable of containing, storing, transmitting, propagating, or transmitting instructions. For example, a computer-readable medium may comprise, but is not limited to, electrical, magnetic, optical, electromagnetic, infrared or semiconductor systems, devices, devices, or propagation media. Specific examples of computer-readable media comprise: magnetic storage devices, such as magnetic tape or hard disk (HDD); optical storage devices, such as optical disk (CD-ROM); memory, such as random access memory (RAM) or flash memory; and/or wired/wireless communication links.

The above detailed description has described the above method and numerous embodiments of the device and system by using schematic diagrams, flow charts, and/or examples. In the case where such diagrams, flowcharts and/or examples contain one or more functions and/or operations, it will be understood by those skilled in the art that each function and/or operation in such diagrams, flowcharts or examples may be individually and/or jointly implemented by any combination of various structures, hardware, software, firmware or entities. In one embodiment, a number of parts of the subject matter of the embodiments of the present disclosure may be implemented through a special integrated circuit (ASIC), a field programmable gate array (FPGA), a digital signal processor (DSP), or other integrated format. However, those skilled in the art will recognize that some aspects of the embodiments disclosed herein may be implemented in an integrated circuit, in whole or in part, equally, as one or more computer programs (e.g., as one or more programs running on one or more computer systems) running on one or more computers, and as one or more programs running on one or more computer systems, one or more programs running on one or more processors (for example, one or more programs running on one or more microprocessors), implemented as firmware, or substantially implemented as any combination of the above methods, and those skilled in the art will have the ability to design circuits and/or write software and/or firmware code according to the disclosure. In addition, those skilled in the art will recognize that the mechanism of the subject matter of the present disclosure can be distributed as a program product of various forms, and the exemplary embodiments of the subject matter of the present disclosure are applicable regardless of the specific type of signal carrying medium actually used to perform the distribution. Examples of signal carrying media comprise, but are not limited to, recordable media, such as floppy disks, hard disk drives, CD discs, DVD discs, digital tapes, computer memories, and transmission media, such as digital and/or analog communication media (such as fiber optic cables, waveguides, wired communication links, wireless communication links, etc.).

Although the disclosure is described in connection with the accompanying drawings, the embodiments disclosed in the accompanying drawings are intended to give an exemplary description of the embodiments of the disclosure, and cannot be understood as a limitation of the disclosure. The scale of dimensions in the drawings is only schematic and cannot be understood as a limitation of the present disclosure.

The above embodiments only illustrate the principle and structure of the disclosure, rather than limit the disclosure. It should be understood by those skilled in the art that any changes and improvements made to the disclosure are within the scope of the disclosure without departing from the overall concept of the disclosure. The scope of protection of the disclosure shall be subject to the scope defined in the claims of the application.

What is claimed is:

1. A display panel, comprising:
a base substrate;
a plurality of sub-pixel units on the base substrate comprising a plurality of light emitting portions respectively;
an electrochromic assembly on a light-emergent side of the plurality of light emitting portions;
a light intensity detector configured to detect an incident intensity of ambient light; and
a liquid crystal adjustment assembly between the electrochromic assembly and the plurality of light emitting portions, or on a side of the electrochromic assembly distal to the plurality of light emitting portions; and
a circular polarizer on a side of one of the electrochromic assembly and the liquid crystal adjustment assembly which is more distal to the plurality of light emitting portions than the other, the side being distal to the plurality of light emitting portions,
wherein the electrochromic assembly comprises a plurality of electrochromic portions covering the plurality of light emitting portions, respectively; and
wherein the transmittance of the plurality of electrochromic portions for ambient light varies with a change in the incident intensity of ambient light.

2. The display panel according to claim 1, wherein the electrochromic assembly further comprises:
a first electrode on one side of the plurality of electrochromic portions facing the plurality of light emitting portions; and
a second electrode on the other side of the plurality of electrochromic portions distal to the plurality of light emitting portions.

3. The display panel according to claim 2, further comprising a controller, which is configured to modulate the plurality of electrochromic portions into a color rendering state by applying a first voltage between the first electrode and the second electrode in response to the incident intensity of ambient light higher than a first threshold, and to modulate the plurality of electrochromic portions into a transparent state by applying a second voltage between the first electrode and the second electrode in response to the incident intensity of ambient light lower than the first threshold,
wherein, as to each of the plurality of electrochromic portions, a transmittance thereof in the color rendering state for light in the predetermined wavelength range is higher than a transmittance thereof in the color rendering state for light having wavelengths other than in the predetermined wavelength range, but is lower than a transmittance thereof in the transparent state for light in the predetermined wavelength range.

4. The display panel according to claim 2, wherein the electrochromic assembly further comprises: a second controllable switching device configured to apply a potential onto or remove a potential from the first electrode or the second electrode.

5. A method for adjusting an intensity of ambient light reflected on the display panel according to claim 2, comprising:
detecting an incident intensity of ambient light;
comparing the incident intensity of ambient light as detected, with a first threshold;
modulating the plurality of electrochromic portions into a color rendering state by applying a first voltage between the first electrode and the second electrode in response to the incident intensity of ambient light which is higher than the first threshold, and modulating the plurality of electrochromic portions into a transparent state by applying a second voltage between the first electrode and the second electrode in response to the incident intensity of ambient light which is lower than the first threshold,
wherein, as to each of the plurality of electrochromic portions, a transmittance thereof in the color rendering state for light in the predetermined wavelength range is higher than a transmittance thereof in the color rendering state for light having wavelengths other than in the predetermined wavelength range, but is lower than a transmittance thereof in the transparent state for light in the predetermined wavelength range.

6. The method according to claim 5, wherein the display panel further comprises:
a liquid crystal adjustment assembly between the electrochromic assembly and the plurality of light emitting portions, or on a side of the electrochromic assembly distal to the plurality of light emitting portions, the liquid crystal adjustment assembly comprising a liquid crystal layer, and a third electrode and a fourth electrode located on both sides of the liquid crystal layer respectively; and
a circular polarizer on a side of one of the electrochromic assembly and the liquid crystal adjustment assembly which is more distal to the plurality of light emitting portions than the other, the side being distal to the plurality of light emitting portions, and
wherein the method further comprises:
comparing the incident intensity of ambient light as detected, with a second threshold;
modulating the liquid crystal layer into a first state by applying a third voltage between the third electrode and the fourth electrode in response to the incident intensity of ambient light which is higher than the second threshold, and modulating the liquid crystal layer into a second state by applying a fourth voltage between the third electrode and the fourth electrode in response to the incident intensity of ambient light which is lower than the second threshold,
wherein, as to the liquid crystal layer, a polarization state of ambient light passing therethrough remains as original in the first state, but is changed thereby in the second state to an extent that an emission ratio of ambient light from the circular polarizer is higher in the second state than in the first state.

7. The display panel according to claim 1, wherein the plurality of the electrochromic portions and the plurality of the light emitting portions are provided in one-to-one correspondence with each other, and an orthographic projection of each of the plurality of the electrochromic portions on the base substrate overlaps with an orthographic projection of a respective one of the plurality of the light emitting portions on the base substrate.

8. The display panel according to claim 7, wherein each of the plurality of the electrochromic portions displays a color which is the same as that of light emitted by the respective one of the plurality of light emitting portions.

9. The display panel according to claim 1, wherein the electrochromic assembly further comprises a light shielding portion located between any two adjacent electrochromic portions.

10. The display panel according to claim 1, wherein the plurality of electrochromic portions comprise a first electrochromic portion formed by 1,1'-disubstituted-4,4'-dipyridyl, a second electrochromic portion formed by $Rh_2O_3$ and a third electrochromic portion formed by $IrO_x$.

11. The display panel according to claim 1, wherein each of the plurality of light emitting portions comprises a cathode, an anode and a light emitting material layer between the cathode and the anode.

12. The display panel according to claim 1, wherein the liquid crystal adjustment assembly comprises:
a liquid crystal layer;
a third electrode, on one side of the liquid crystal layer facing the plurality of light emitting portions; and
a fourth electrode, on the other side of the liquid crystal layer distal to the plurality of light emitting portions.

13. The display panel according to claim 12, further comprising a controller, which is configured to modulate the liquid crystal layer into a first state by applying a third voltage between the third electrode and the fourth electrode in response to the incident intensity of ambient light higher than a second threshold, and to modulate the liquid crystal layer into a second state by applying a fourth voltage between the third electrode and the fourth electrode in response to the incident intensity of ambient light lower than the second threshold,
wherein, as to the liquid crystal layer, a polarization state of ambient light passing therethrough remains as original in the first state, but is changed thereby in the second state to an extent that an emission ratio of ambient light from the circular polarizer is higher in the second state than in the first state.

14. The display panel according to claim 13, wherein the liquid crystal layer in the second state has the same properties as a quarter wave plate.

15. The display panel according to claim 13, wherein the controller is further configured to modulate the plurality of electrochromic portions into a color rendering state by, applying a first voltage between the first electrode and the second electrode in response to the incident intensity of ambient light higher than a first threshold, and to modulate the plurality of electrochromic portions into a transparent state by applying a second voltage between the first electrode and the second electrode in response to the incident intensity of ambient light lower than the first threshold,
wherein, as to each of the plurality of electrochromic portions, a transmittance thereof in the color rendering state for light in the predetermined wavelength range is higher than a transmittance thereof in the color rendering state for light having wavelengths other than in the predetermined wavelength range, but is lower than a transmittance thereof in the transparent state for light in the predetermined wavelength range, and the first threshold is the same as or different from the second threshold.

16. The display panel according to claim 12, wherein the liquid crystal adjustment assembly further comprises: a first controllable switching device configured to apply a potential onto or remove a potential from the third electrode or the fourth electrode.

17. A method for preparing a display panel, comprising:
providing a base substrate;
forming a plurality of light emitting portions on the base substrate;
forming an electrochromic assembly on a light-emergent side of the plurality of light emitting portions, the electrochromic assembly comprising a first electrode, a second electrode and a plurality of electrochromic portions covering the plurality of light emitting portions, respectively,
providing a light intensity detector configured to detect an incident intensity of ambient light,
forming a liquid crystal adjustment assembly between the electrochromic assembly and the plurality of light emitting portions, or on a side of the electrochromic assembly distal to the plurality of light emitting portions, and
forming a circular polarizer on a side of one of the electrochromic assembly and the liquid crystal adjustment assembly which is more distal to the plurality of light emitting portions than the other, the side being distal to the plurality of light emitting portions,
wherein the transmittance of the plurality of electrochromic portions for ambient light varies with a change in the incident intensity of ambient light.

* * * * *